(12) United States Patent
Surdeanu et al.

(10) Patent No.: US 7,659,169 B2
(45) Date of Patent: Feb. 9, 2010

(54) SEMICONDUCTOR DEVICE AND METHOD OF MANUFACTURING THEREOF

(75) Inventors: Radu Surdeanu, Roosbeek (BE); Erwin Hijzen, Blanden (BE); Michael Antoine Zandt, Veldhoven (NL); Raymond Josephus Hueting, Hengelo (NL)

(73) Assignee: NXP B.V., Eindhoven (NL)

( * ) Notice: Subject to any disclaimer, the term of this patent is extended or adjusted under 35 U.S.C. 154(b) by 255 days.

(21) Appl. No.: 11/574,341

(22) PCT Filed: Aug. 10, 2005

(86) PCT No.: PCT/IB2005/052660

§ 371 (c)(1),
(2), (4) Date: Oct. 8, 2007

(87) PCT Pub. No.: WO2006/024979

PCT Pub. Date: Aug. 9, 2006

(65) Prior Publication Data

US 2008/0194069 A1 Aug. 14, 2008

(30) Foreign Application Priority Data

Sep. 2, 2004 (EP) .................................. 04104206

(51) Int. Cl.
*H01L 21/336* (2006.01)
(52) U.S. Cl. ................. 438/283; 257/E21.179
(58) Field of Classification Search .................. 438/157, 438/924, 283, 588; 257/365, 366, E21.179
See application file for complete search history.

(56) References Cited

U.S. PATENT DOCUMENTS 5,349,228 A  9/1994  Neudeck et al.

(Continued)

FOREIGN PATENT DOCUMENTS

JP  2003309267  10/2003

(Continued)

OTHER PUBLICATIONS

H. J. A. Van Dijk et al; "Preparation of Thin Silicon Crystals by Electrochemical Thinning of Epitaxially Grown Structures"; Philips Research Laboratories, N.V. Philips Gloeilampenfabrieken, Eindhoven, Netherlands; Journal Electrochemical Society; vol. 117, No. 4; Apr. 1970; pp. 553-554.

(Continued)

*Primary Examiner*—Walter L Lindsay, Jr.
*Assistant Examiner*—Reema Patel

(57) ABSTRACT

There is a method of manufacturing a semiconductor device with a dual gate field effect transistor, the method including a semiconductor body a semiconductor material having a surface with a source region and a drain region of a first conductivity type and with a channel region of a second conductivity type opposite to the first conductivity type between the source region and the drain region and with a first gate region separated from the surface of the semiconductor body by a first gate dielectric above the channel region and with a second gate region situated opposite to the first gate region and formed within a recess in an opposite surface of the semiconductor body so as to be separated from the channel region by a second gate dielectric wherein the recess is formed with a local change of the doping of the channel region and by etching starting from the opposite surface of the semiconductor body.

9 Claims, 4 Drawing Sheets

U.S. PATENT DOCUMENTS

| | | | |
|---|---|---|---|
| 5,461,250 | A | 10/1995 | Burghartz et al. |
| 5,736,435 | A | 4/1998 | Venkatesan et al. |
| 5,773,331 | A | 6/1998 | Solomon et al. |
| 5,849,612 | A | 12/1998 | Takahashi et al. |
| 6,621,124 | B2 * | 9/2003 | Ponomarev ................. 257/347 |
| 2001/0017392 | A1 | 8/2001 | Comfort et al. |
| 2006/0092695 | A1 | 5/2006 | Choi et al. |
| 2006/0203430 | A1 | 9/2006 | Pinnow et al. |
| 2007/0099405 | A1 | 5/2007 | Oliva et al. |

FOREIGN PATENT DOCUMENTS

| | | |
|---|---|---|
| WO | WO 01/65609 A1 | 9/2001 |

OTHER PUBLICATIONS

J. C. Green; "Ethylene Diamine-Catechol-Water Mixture Shows Preferential Etching of p-n Junction"; Standard Telecommunication Laboratories, Harlow, Essex, England; Journal Electrochemical Society; vol. 116, No. 9; Sep. 1969; pp. 1325-1326.

J. B. Price et al; "Diffusion of Manganese in Single Crystalline Manganous Oxide"; Materials Research Center, Northwestern University, Evanston, Illinois; Journal Electrochemical Society; vol. 117, No. 2; Feb. 1970; pp. 242-247.

* cited by examiner

SEMICONDUCTOR DEVICE AND METHOD OF MANUFACTURING THEREOF

The invention relates to a method of manufacturing a semiconductor device with a dual gate field effect transistor, in which method a semiconductor body of a semiconductor material is provided at a surface thereof with a source region and a drain region of a first conductivity type and with a channel region of a second conductivity type opposite to the first conductivity type between the source region and the drain region and with a first gate region separated from the surface of the semiconductor body by a first gate dielectric above the channel region and with a second gate region situated opposite to the first gate region and formed within a recess in an opposite surface of the semiconductor body so as to be separated from the channel region by a second gate dielectric, wherein the recess is formed by means of a local change of the doping of the channel region and by performing an etching step starting from the opposite surface of the semiconductor body. Such a method is very suitable for making advanced semiconductor ICs (=Integrated Circuits), since the second gate is used to suppress so-called short-channel effects which occur in a MOSFET (=Metal Oxide Semiconductor Field Effect Transistor) having a very small size.

Figure 1:
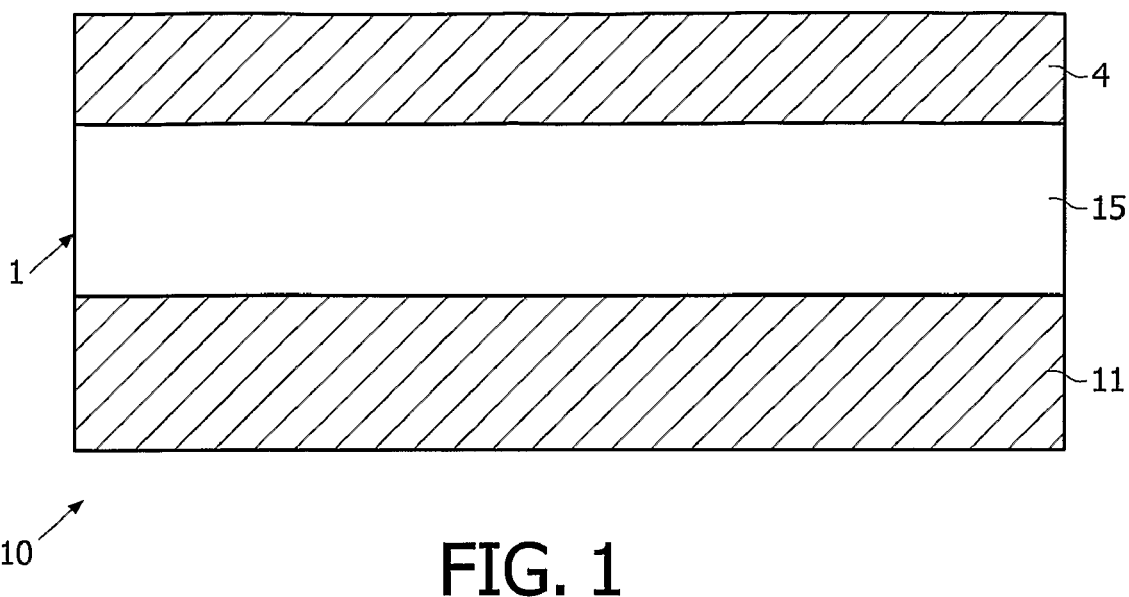
Figure 2:
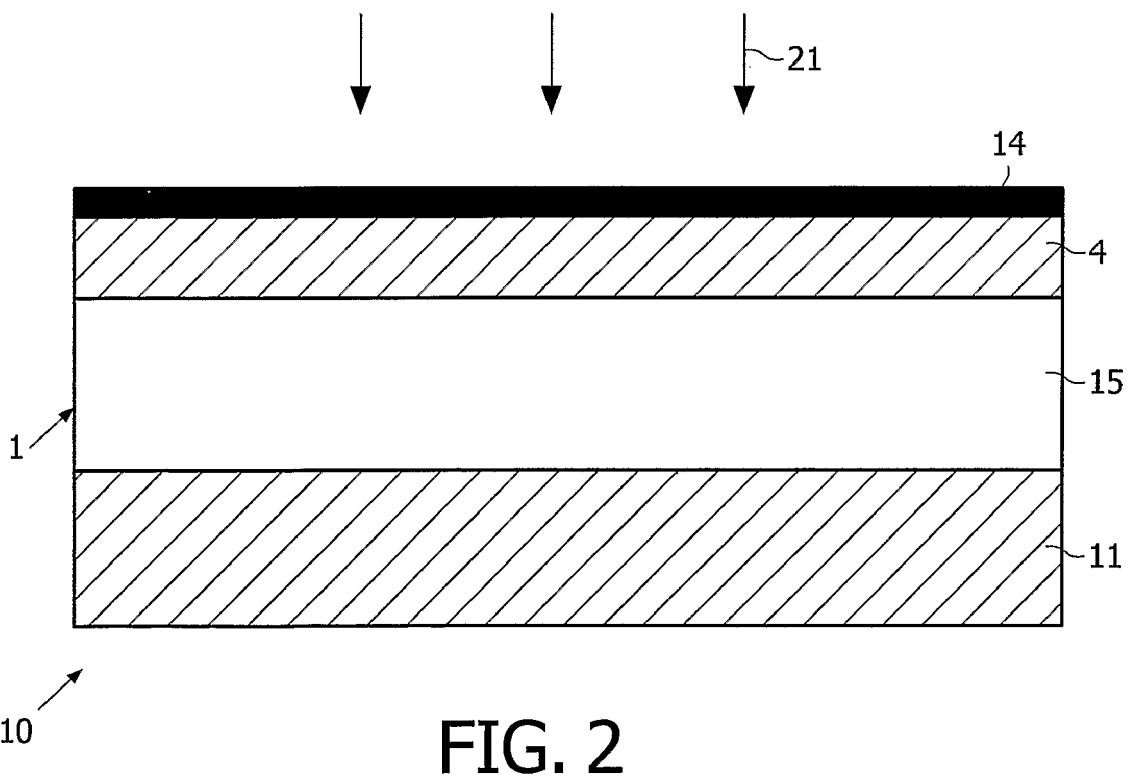
Figure 3:
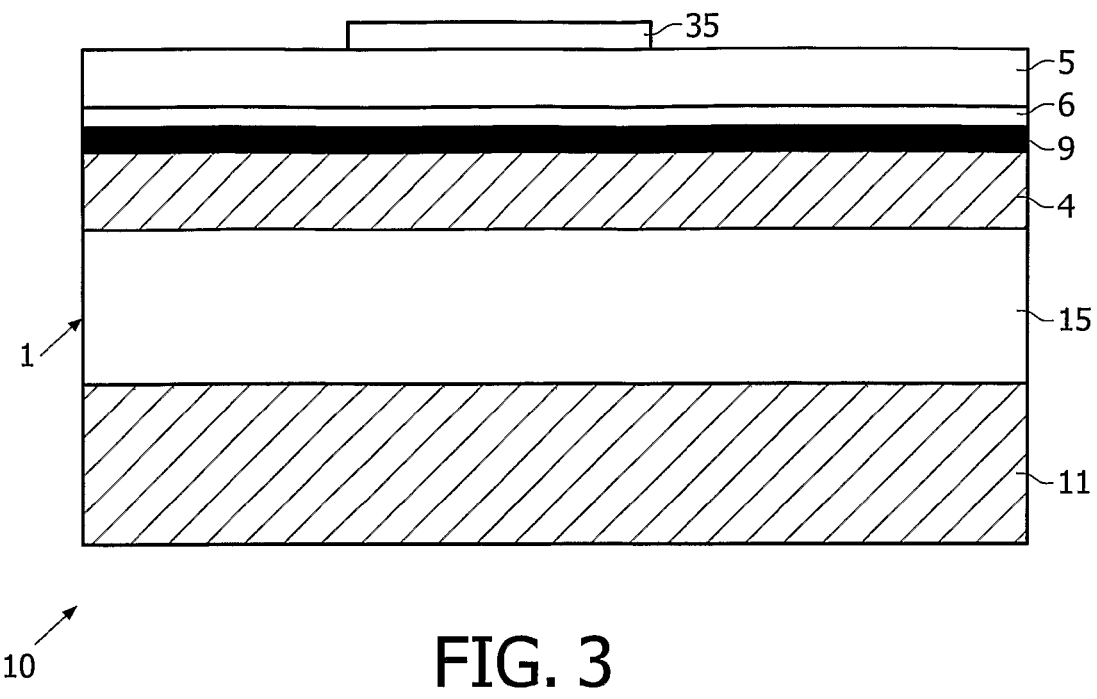
Figure 4:
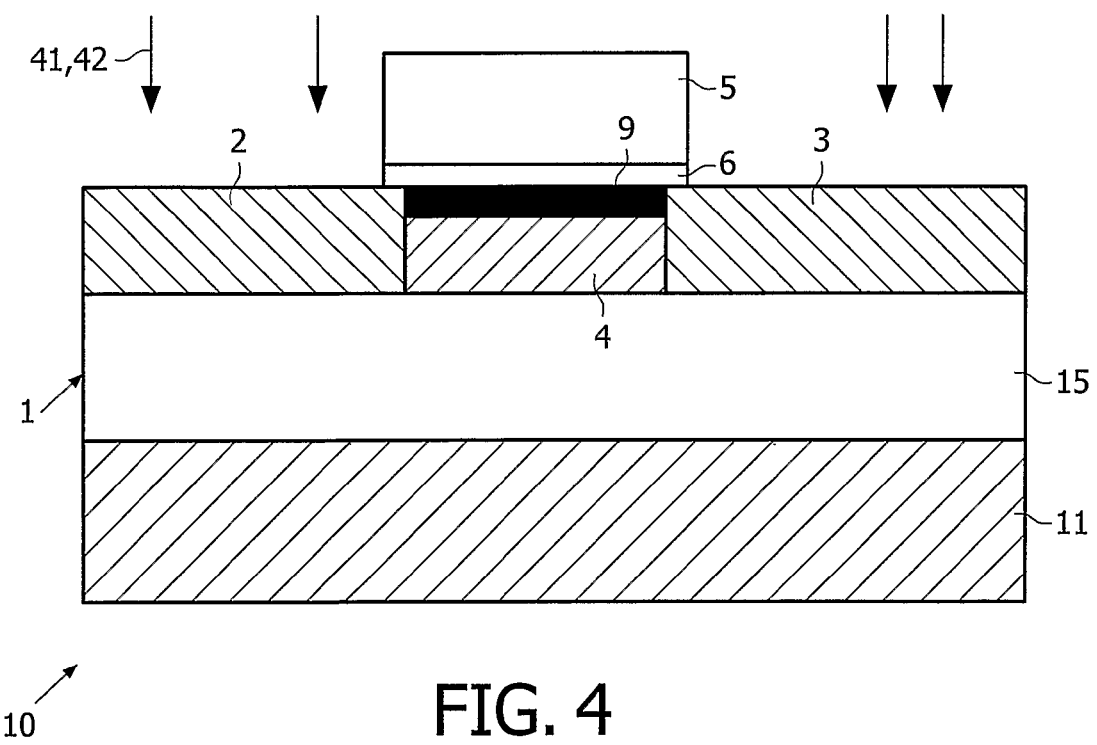
Figure 5:
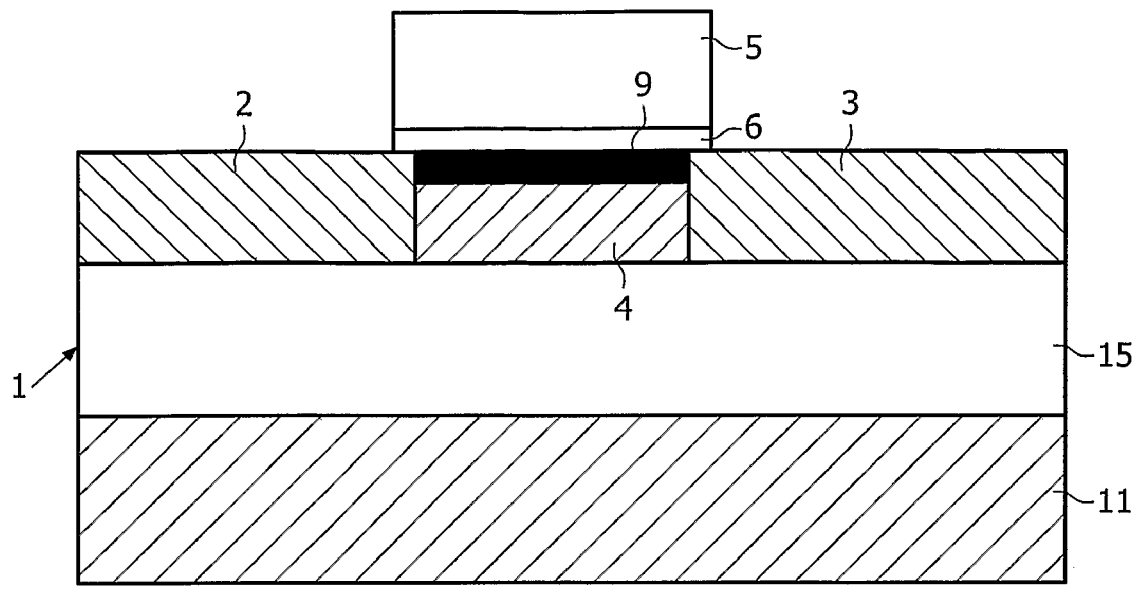
Figure 6:
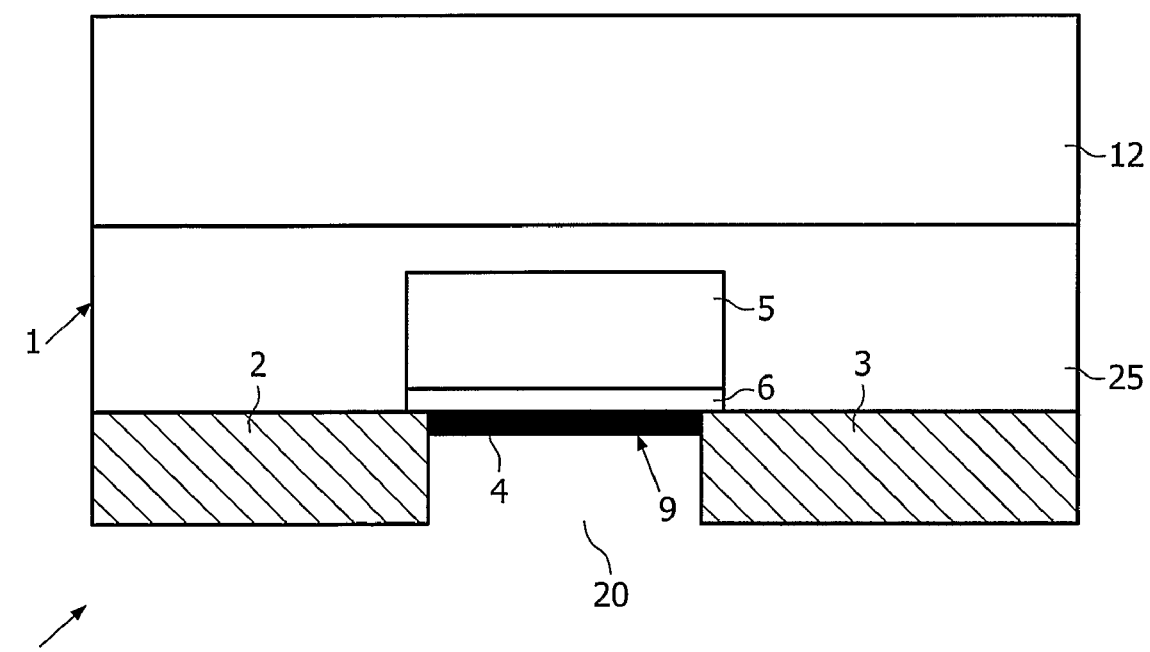
Figure 7:
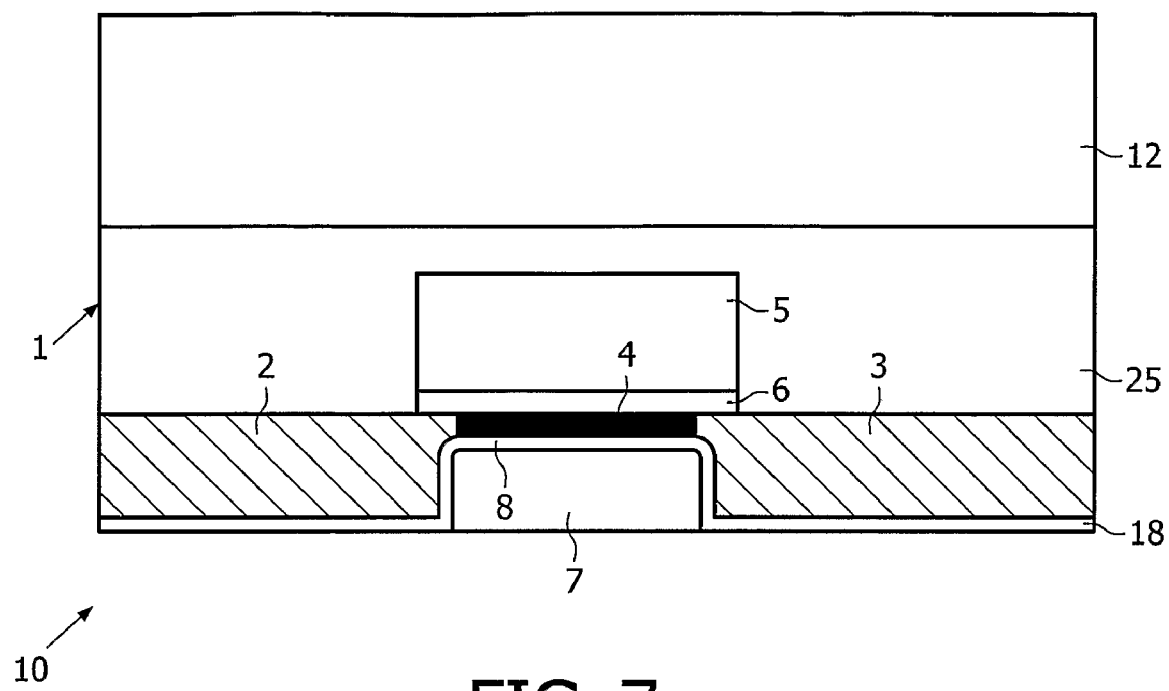

A method as mentioned in the opening paragraph is known from PCT patent application WO 01/65609 A1 that was published on Sep. 7, 2001. Therein (see e.g. FIGS. 1 and 2 and the corresponding parts of the description) a first gate region is formed on the main surface of the semiconductor body and the second gate is formed in a recess formed in an opposite side of the semiconductor body. Oxidation-enhancing impurities are introduced into the semiconductor device in such a way that the impurities are locally present near the rear interface of the semiconductor body. This is achieved by implanting from the main side through the first gate region. In this way the impurities that are implanted outside the first gate region are outside the semiconductor body, that is in a silicon oxide layer of the SOI (=Silicon On Insulator) wafer which is below the upper silicon region of the semiconductor body. Next, a heat treatment is performed such that an oxide layer is formed in the upper silicon region at the location where the impurities are present in the silicon upper region. Next, the substrate of the SOI wafer and the silicon oxide layer are removed by etching the silicon dioxide, e.g. in an HF solution. In this way the recess is formed so as to be in alignment with the first gate region, and the second gate region is subsequently formed in the recess.

A drawback of such a method is that it is not easy to obtain a channel region which is very thin in order to optimize the effect of the second gate on the short-channel effects. Moreover, the very long time needed to form a deep recess is not practical.

It is therefore an object of the present invention to avoid the above drawbacks and to provide a method which does enable the manufacture of a very thin channel region and which moreover is very practical.

To achieve this, a method of the type described in the opening paragraph is characterized in that the local change of the doping of the channel region is provided close to the surface of the semiconductor body and in that the semiconductor body in the channel region is etched with an etching agent for the material of the semiconductor body and the local change of the doping of the channel region is used as an etch stop region. The invention is based first on the recognition that chemically etching the semiconductor body in order to form the recess is both fast and efficient and does not require a heat treatment. Moreover the invention is based on the recognition that dopant impurities, more precisely a change in the local doping, can be used as an etch stop region in chemical etching processes. By positioning the local change in the doping close to the (main) surface of the semiconductor body, it is possible to obtain a very thin channel region. Finally, the invention is based on the recognition that positioning such a change in the doping close to the surface still allows for a thin upper region of the semiconductor body having the required or even optimal properties in order to function as a channel region.

In a first preferred embodiment of a method according to the invention, for the local change in the doping of the channel a retrograde doping concentration profile in the channel region is used. Such a doping concentration profile on the one hand allows for a thin channel region of the correct conductivity type and doping concentration and on the other hand for a local change that is large enough to function as an etch stop region. For an NMOST, p-type impurities are preferably used, while for a PMOST, n-type impurities are used. This is different from the known method in which optimal results are mainly obtainable for n-type impurities, in particular As atoms.

The required local change in the doping may easily be obtained by ion implantation. Thus, preferably the retrograde doping concentration of the channel region is obtained by implanting impurities of the second conductivity type from the surface of the semiconductor body.

In a further preferred embodiment of a method according to the invention, for the local change in the doping of the channel a change in the conductivity type in the channel region is used. A pn junction formed in the channel region close to the surface of the semiconductor body can very well function as an etch stop region, in particular for several electrochemical etching techniques. It is not objectionable if the lower part of the channel region is of the first conductivity type, since said lower part is removed by the etching process. Said pn junction may also be formed using ion implantation. In this case ions are to be implanted that are impurities of a conductivity type opposite to that of the channel region, thus first conductivity type impurities.

Another possibility is to form a thin first conductivity type layer in the second conductivity type channel region and close to the surface of the semiconductor body. In this way the part of the semiconductor body which is to be removed by etching in order to form the recess comprises a second conductivity type region bordered in the direction of the first gate region by the thin first conductivity type layer and in the lateral direction by the source and drain regions—provided that they have already been formed at this stage of the manufacturing process—which are also of the first conductivity type. Removing the second conductivity region by electrochemical etching thus allows for a very thin channel region and very precise alignment of the second gate region with the first gate region.

In a further embodiment the source and drain regions are formed before the recess is formed and are used as further etch stop regions when the walls of the recess are being formed.

In a modification of the above-mentioned embodiments, the etch stop region—after reaching said etch stop region—is removed by etching. Since the etch stop region may be very thin, this can be done in relatively accurate manner.

In this way a thin opposite conductivity type layer that was positioned in the channel region can be removed, but also a remaining part of a peak in the doping profile of the same conductivity type as the channel region can be removed.

Preferably, after the formation of the recess, the bottom and the walls thereof are provided with a dielectric layer and the recess is filled with the material of the second gate region. At the bottom of the recess the dielectric layer forms the second dielectric region and on the walls of the recess it forms an electrical insulation from the source and drain regions towards the second gate region.

As mentioned hereinabove, an electrochemical etching technique is preferably used to form the recess. Selective electrochemical etching can be used. See e.g. Van Dijk et. al., J. Electrochem. Soc. 117, 553 (1970). Also electrochemically controlled thinning of Silicon is possible. In the latter case use is made of the principle that the etch rate of silicon in a KOH solution is strongly potential dependent. See e.g. Waggener et. al., Electrochem. Soc. Conf. Atlantic City, abstr. 183, October 1970 and Waggener et. al., B.S.T.J. 49, 473, (1970). Finally, selective chemical etching can be used. See e.g. Greenwood, J. Electrochem. Soc. 116, 1325 (1969). More in general etching techniques can be used that are based on an abrupt change in the impurity concentration or on the electrical behavior of a pn-junction.

Preferably, a silicon on insulator (SOI) wafer is used for forming the dual gate transistor and the second gate is preferably formed after a substrate transfer process.

The invention further comprises a semiconductor device with a dual gate field effect, transistor which is obtained with a method according to the invention.

These and other aspects of the invention will be apparent from and elucidated with reference to the embodiments described hereinafter, to be read in conjunction with the drawing, in which FIGS. 1 through 7 are sectional views of a semiconductor device with a dual gate MOST at various stages in the manufacturing process of the device by means of a method in accordance with the invention.

The Figures are diagrammatic and not drawn to scale, the dimensions in the thickness direction being particularly exaggerated for greater clarity. Corresponding parts are generally given the same reference numerals and the same hatching in the various Figures.

FIGS. 1 through 7 are sectional views of a semiconductor device with a dual gate MOST at various stages in the manufacturing process of the device by means of a method in accordance with the invention. The starting point in the manufacture is (see FIG. 1) a SOI wafer 11 comprising a silicon dioxide layer 15 having a thickness in the range of 50 to 400 nm that separates a thin, e.g. 10 to 20 nm thick, e.g. p-type silicon region 4 from the (remainder) of the substrate 11, e.g. a p-type silicon substrate.

In the thin silicon region 4 (see FIG. 2) a retrograde doping concentration profile 14 is formed by means of ion implantation 21, in this case of Boron atoms which do not change the conductivity type but provide a local change in the doping of the channel region 4. The dose of such an implantation may be between $5\times10^{12}$ and $5\times10^{13}$ at/cm$^2$ and the energy is such that the peak of the profile is positioned as needed, e.g. around 2-6 nm below the surface of the semiconductor body 1. This position can be very well controlled and depends on the implant species, the gate height, oxide thickness and the use of a hard mask. The channel doping at the peak level should be around $1\times10^{18}$ at/cm$^3$. An anneal can be performed at this stage for activation of the dopant impurities or can be carried out at a later stage together with the source/drain anneal.

The process continues (see FIG. 3) with the patterning of the gate: a dielectric layer 6, e.g. of thermal silicon dioxide, and a gate region layer 5 are formed and a mask 35 is positioned at the location of the first gate region 5 to be formed.

After etching of layers 5,6 (see FIG. 4) two implantations 41,42 with no tilt will follow. First a pre-amorphization implant 41, typically with Germanium, is carried out. The dose is in the range of $2\times10^{14}$ and $1\times10^{15}$ at/cm$^2$ and the energy is between 8 and 20 keV. Next a dopant implant 42, e.g. with Arsenic, is carried out. The dose is e.g. $1\times10^{15}$ at/cm$^2$ and the energy is e.g. 1 keV. In the case of an NMOST, as in this example, the pre-amorphization step may be skipped since As and Sb are self-amorphizing species.

Subsequently (see FIG. 5) a low thermal budget, diffusionless anneal step follows such an SPE (=Solid Phase Epitaxy) step. This will activate the source and drain regions 2,3 (defined by the pre-amorphization step), without diffusion of the dopants outside the pre-amorphized region. The junctions obtained are highly activated and laterally highly abrupt (about 1 nm/decade).

Next (see FIG. 6) a substrate transfer step is applied and the semiconductor body 1 is attached to a further substrate 12, e.g. of glass, by means of a glue layer 25. The substrate 11 and the isolating layer 15 are removed by etching processes and chemical-mechanical polishing. At this point an electrochemical etch is applied, e.g. an aqueous solution of KOH. As a result, the undoped or very lightly doped part of the channel region 4 below the peak 9 of the retrograde doping profile is etched away down to the junctions just formed between the, here p-type, channel region 4 and the source and drain regions 2,3, which obviously are n++ doped. The etch stop region 9 is the p+ doping concentration level of the retrograde channel region 4 doping, thus leaving a channel region 4 under the first gate region 5, well defined within e.g. 1 nm, which is between 2-6 nm thick.

From this point (see 7) the process continues with the deposition of a second dielectric layer 18 and filling the recess 20 with the material for the second gate region 7. By means of a separating technique, like sawing, individual devices 10 are obtained comprising e.g. a MOS or CMOS IC. Of course other active or passive elements, like bipolar transistors, can be integrated as well.

It will be obvious that the invention is not limited to the examples described herein, and that within the scope of the invention many variations and modifications are possible to those skilled in the art.

For example, other materials, compositions and thicknesses may be used for various layers and regions. The semiconductor body could comprise Ge, GaAs or other semiconductor materials or alloys of such materials. The gate regions may comprise polycrystalline silicon but may also be formed as metal gates.

The invention claimed is:

1. Method of manufacturing a semiconductor device with a dual gate field effect transistor, in which method
    a semiconductor body of a semiconductor material is provided at a surface thereof with a source region and a drain region of a first conductivity type and
    with a channel region of a second conductivity type opposite to the first conductivity type between the source region and the drain region and
    with a first gate region separated from the surface of the semiconductor body by a first gate dielectric above the channel region and with a second gate region situated opposite to the first gate region and formed within a recess in an opposite surface of the semiconductor body so as to be separated from the channel region by a second gate dielectric,
    wherein the recess is formed by means of a local change of the doping of the channel region and by performing an etching step starting from the opposite surface of the semiconductor body, characterized in that the local change of the doping of the channel region is provided close to the surface of the semiconductor body and in that the semiconductor body in the channel region is etched with an etching agent for the material of the semiconductor body and the local change of the doping of the channel region is used as an etch stop region.

2. Method according to claim 1, characterized in that for the local change in the doping of the channel region a retrograde doping concentration profile in the channel region is used.

3. Method according to claim 2, characterized in that the retrograde doping concentration of the channel region is obtained by implanting impurities of the second conductivity type from the surface of the semiconductor body.

4. Method according to claim 1, characterized in that for the local change in the doping of the channel region a change in the conductivity type in the channel region is used.

5. Method according to claim 1, characterized in that the source and drain regions are formed before the recess is formed and are used as further etch stop regions when the walls of the recess are being formed.

6. Method according to claim 1, characterized in that after reaching the etch stop region, said etch stop region is removed by further etching.

7. Method according to claim 1, characterized in that after the formation of the recess, the bottom and the walls thereof are provided with a dielectric layer and the recess is filled with the material of the second gate region.

8. Method according to claim 1, characterized in that an electrochemical etching technique is used to form the recess.

9. Method according to claim 1, characterized in that a silicon-on-insulator wafer is used for forming the dual gate transistor and the second gate region is formed using a substrate transfer technique with a further wafer.

* * * * *